United States Patent
Rushabh et al.

(10) Patent No.: US 11,948,757 B2
(45) Date of Patent: Apr. 2, 2024

(54) CONTACTOR WITH CONTACT CARRIER LOCATION SENSING

(71) Applicant: Eaton Intelligent Power Limited, Dublin (IE)

(72) Inventors: Jariwala Rushabh, Pune (IN); Daniel Heckenkamp, Oconomowoc, WI (US)

(73) Assignee: EATON INTELLIGENT POWER LIMITED, Dublin (IE)

( * ) Notice: Subject to any disclaimer, the term of this patent is extended or adjusted under 35 U.S.C. 154(b) by 513 days.

(21) Appl. No.: 16/962,243

(22) PCT Filed: Jan. 7, 2019

(86) PCT No.: PCT/EP2019/050220
§ 371 (c)(1),
(2) Date: Jul. 15, 2020

(87) PCT Pub. No.: WO2019/141529
PCT Pub. Date: Jul. 25, 2019

(65) Prior Publication Data
US 2020/0365338 A1    Nov. 19, 2020

(30) Foreign Application Priority Data

Jan. 16, 2018  (IN) .............................. 201811001843
Mar. 2, 2018   (GB) ...................................... 1803422

(51) Int. Cl.
*H01H 67/02*      (2006.01)
*G01R 31/327*     (2006.01)
(Continued)

(52) U.S. Cl.
CPC ....... *H01H 1/0015* (2013.01); *G01R 31/3278* (2013.01); *H01H 50/546* (2013.01); *H02P 1/022* (2013.01); *H01H 2071/044* (2013.01)

(58) Field of Classification Search
CPC .............. H01H 1/0015; H01H 50/546; H01H 2071/044; H01H 11/0062; H01H 50/08;
(Continued)

(56) References Cited

U.S. PATENT DOCUMENTS 3,184,713 A * 5/1965 Standaart .................. G06F 3/06
                                                          335/134
4,937,543 A * 6/1990 Ressel ..................... H01H 50/14
                                                          335/133
(Continued)

FOREIGN PATENT DOCUMENTS

CN        204809144 U     11/2015
CN        205081061 U      3/2016
(Continued)

*Primary Examiner* — Shawki S Ismail
*Assistant Examiner* — Lisa N Homza
(74) *Attorney, Agent, or Firm* — LEYDIG, VOIT & MAYER, LTD.

(57) ABSTRACT

A contactor includes: at least one moveable contact mounted on a contact carrier; at least one stationary contact mounted on a housing; an electromagnet arranged to cause the contact carrier to move relative to the housing between a first position and a second position, and thus to cause the at least one moveable contact to travel from a contacts open position to a contacts closed position with respect to the at least one stationary contact; a sensor coupled to one of the contact carrier and the housing and arranged to detect an intermediate position, in between the first position and the second position, at which the housing and the contact carrier are located at a given moment in time as the contact carrier moves relative to the housing between the first position and the second position; and a controller connected to receive the signals from the sensor.

14 Claims, 5 Drawing Sheets

(51) Int. Cl.
  *H01H 1/00* (2006.01)
  *H01H 50/54* (2006.01)
  *H02P 1/02* (2006.01)
  *H01H 71/04* (2006.01)

(58) Field of Classification Search
  CPC ............ H01H 9/167; H01H 2071/048; G01R 31/3278; G01R 31/3274; H02P 1/022
  USPC .......................................................... 335/131
  See application file for complete search history.

(56) References Cited

U.S. PATENT DOCUMENTS

| | | | | |
|---|---|---|---|---|
| 5,150,092 A | * | 9/1992 | Kolb | ...................... H01H 71/58 |
| | | | | 200/332.2 |
| 5,450,048 A | * | 9/1995 | Leger | ................. H01H 71/7409 |
| | | | | 335/132 |
| 5,521,567 A | * | 5/1996 | Devonald, III | ...... H01H 33/022 |
| | | | | 361/600 |
| 5,541,561 A | * | 7/1996 | Grunert | .................. H01H 89/06 |
| | | | | 335/16 |
| 5,606,299 A | * | 2/1997 | Innes | .................. H01H 71/0228 |
| | | | | 335/132 |
| 5,652,420 A | * | 7/1997 | Innes | ...................... H01H 83/22 |
| | | | | 361/729 |
| 5,754,387 A | | 5/1998 | Fons et al. | |
| 6,064,289 A | * | 5/2000 | Wieloch | ............... H01H 50/546 |
| | | | | 335/10 |
| 6,476,697 B2 | * | 11/2002 | Swartzentruber | .... H01H 50/546 |
| | | | | 335/132 |
| 6,611,416 B1 | | 8/2003 | Cleereman et al. | |
| 6,949,997 B2 | * | 9/2005 | Bergh | .................. H01H 50/326 |
| | | | | 335/78 |
| 7,212,090 B2 | * | 5/2007 | Kadah | ...................... H01H 9/56 |
| | | | | 361/160 |
| 2008/0074215 A1 | * | 3/2008 | Zhou | .................... H01H 1/0015 |
| | | | | 335/132 |
| 2010/0060287 A1 | * | 3/2010 | Keil | ....................... H01H 50/08 |
| | | | | 324/418 |
| 2014/0090965 A1 | * | 4/2014 | Leccia | ............... G01R 31/3274 |
| | | | | 200/308 |
| 2015/0096874 A1 | | 4/2015 | Dedina | |
| 2019/0019643 A1 | * | 1/2019 | Bobert | .................. H01H 71/04 |

FOREIGN PATENT DOCUMENTS

| | | | | |
|---|---|---|---|---|
| DE | 10260249 A1 | | 8/2004 | |
| DE | 102016107127 A1 | | 8/2017 | |
| EP | 2290666 A1 | | 3/2011 | |
| EP | 2960923 A1 | | 12/2015 | |
| EP | 3041013 A1 | | 7/2016 | |
| WO | WO-2017129823 A1 | * | 8/2017 | ......... H01H 36/0006 |

* cited by examiner

CONTACTOR WITH CONTACT CARRIER LOCATION SENSING

CROSS-REFERENCE TO PRIOR APPLICATIONS

This application is a U.S. National Phase application under 35 U.S.C. § 371 of International Application No. PCT/EP2019/050220, filed on Jan. 7, 2019, and claims benefit to British Patent Application No. GB 1803422.3, filed on Mar. 2, 2018 and to Indian Patent Publication No. IN 2018/11001843, filed on Jan. 16, 2018. The International Application was published in English on Jul. 25, 2019 as WO 2019/141529 under PCT Article 21(2).

FIELD

The present invention relates to contactors and methods in contactors.

BACKGROUND

Contactors are generally used in motor starter applications to switch on/off a load. The contactor may have an overload relay attached that is used to protect a motor from overcurrent. As such, a typical contactor has three contact assemblies: a contact assembly for each phase or pole of a three-phase electrical device. Each contact assembly, in turn, includes a pair of stationary contacts and a pair of moveable contacts. One stationary contact will be a line side contact and the other stationary contact will be a load side contact. The moveable contacts are controlled by an actuating assembly comprising a contact carrier and an armature magnet assembly which is energized by a coil to move the moveable contacts to form a bridge between the stationary contacts. When the moveable contacts are engaged with both stationary contacts, current is allowed to travel from the power source or line to the load or electrical device. When the moveable contact is separated from the stationary contacts, an open circuit is created and the line and load are electrically isolated from one another.

Each contact assembly, and each set of moveable and stationary contacts thereof, corresponds to a pole or phase of the same three phase input. Thus, in some contactors, the three pairs of moveable contacts are all moved between open and closed positions in unison. Other contactors, however, provide for independent or timed control of each pair of moveable contacts, such as in systems that use so-called "Point-on-Wave" switching. In addition, many contactors utilize variations intended to render them more tolerable or more sensitive to current overloads, such as contacts that automatically blow open upon an overload before an open command is received. The development of these alternatives illustrates a general recognition in the art that, despite their relative durability, all contactors have a finite useable life. Component wear, contact surface erosion, friction, jam, contact welding, arc-generated debris, and other factors limit the length of time and/or number of operations through which a contactor may be used.

Since contactors and motor starters are important components of both automation and control systems, it is advantageous to monitor their remaining useable life, or "wellness," to predict impending faults before occurrence. Un-predicted failures of contactors not only cause costly work stoppages, but also can cause damage to the load and other related systems and equipment. In contrast, overcautious approaches to contactor monitoring and replacement increase maintenance costs and slow or delay usage of the motor/load.

Conventionally, methods for estimating the working life of contactors relied upon the manufacturer's life test data or guidelines. That is, most commercially available contactors have a designated number of operations or cycles after which the manufacturer recommends replacement to avoid failure in use. Thus, many systems and methods for predicting failure simply count the number of operations that a contactor completes. However, each contactor will not necessarily operate for the same number of cycles before failure. And, the causes of failure vary among contactors as well as the conditions which lead to possible failure issues. How a contactor is operated, the conditions under which it is used, and the characteristics of the environment in which it is used cause even more variation in the number of operations a contactor might undergo before failure. Therefore, to be useful, counting methods must be overly cautious in setting replacement schedules, or risk contactor failures while in use.

Other approaches for monitoring contactors have been centered on determining whether a connection between the movable and stationary contacts was actually made properly. Thus, some systems have compared actuating coil current to reference values to determine whether contacts have fully closed. Similar systems have measured the impedance of the actuating coil by monitoring the decay rate of current therethrough during a period when a supply regulator is turned off. Since impedance will vary appreciably depending on whether the contacts are fully open or closed, the state of the contacts can be determined. More simplistic methods of monitoring contactors have involved the use of simple mechanical translations of the position of the contacts, whether open or closed. Other approaches use optical devices to detect the presence or brightness of arc emissions indicating that a failure has occurred. However, such approaches are not believed to have the ability to reliably predict impending failures, only to detect existing failures.

Systems similar to those described above are also used for safety interlocking. That is, an additional set of contacts are coupled to the primary moveable and stationary contacts such that they engage in a closed position when the primary contacts engage and separate when the primary contacts separate. These additional sets of contacts are known as interlocks or mirror contacts. The drawback to such a method of ensuring proper contact closure is that only a rough mechanical translation of contact closure is available. Thus, the interlock contacts are just as susceptible to jam, friction, wear, erosion, and other problems as are the primary contacts. Also, even when working properly, the interlocks provide limited information-whether the contacts are properly closed. In contrast, a system which predictively monitors currents and/or voltages of the electromagnetic contactor itself can provide more data on contact movement and can provide such data throughout a complete operating cycle (initiation through coil operation and current flow to contact opening).

CN205081061 discloses a magnetic holding relay comprising a shell, a movable contact piece. A magnetism-holding relay includes a photoelectric sensor 6 having a position of the sensing pad 4, which is located at one end of the pad 4 and is provided with a photo sensor. The sensing extension 42 is moved away from the photoelectric sensor 6, and the photoelectric sensor 6 can sense the pad 4. The photoelectric sensor can be set to facilitate the detection of the location of the pad and the work of the relay. It appears that pad location detection is utilized to provide stable operation in the presence of electromagnetic noise and vibration.

US2008074215 discloses monitoring a contactor. By monitoring actuating coil current, actuating coil voltage, line current, and/or line voltage, wellness metrics can be calculated which, when compared to threshold values, may be used as indicators of remaining life and/or imminent failures.

U.S. Pat. No. 6,611,416 discloses monitoring main contacts and auxiliary contacts of a power contactor. The apparatus includes four circuits, the first of which has an on state in which a coil of the contactor is energized, and an off state. The first circuit switches from the off state to the on state when a power source is electrically connected to the first circuit if an additional signal is also present, and then remains in the on state until the power source is disconnected. The second circuit prevents the additional signal from being received by the first circuit when the auxiliary contact is in a position indicating that one of the main contacts is welded. The third circuit causes the first circuit to be disconnected from the power source when the fourth circuit provides a signal indicating that one of the auxiliary contacts is welded.

DE10260249A discloses the switching contacts of a switchgear mechanism (100) are set to the on position or the off position, wherefore pressure is generated by the contact force spring in order to apply the pre-determined contact force in the on position. The service life of one such switchgear is determined by the erosion of switching contacts and by the mechanical wear of the switchgear mechanism. The pressure change is detected during the switching-on process, and especially the mechanical wear of the switchgear can be simultaneously determined. The device comprises a magnetic drive (100) consisting of an armature (110), a yoke (101) and magnetising coils (102, 102'), a position transmitter (120) being coupled to the magnetic armature (110) in a positively engaging manner.

EP2960923A discloses a switching arrangement (1), in particular for the high-voltage and/or high-current region, with two contacts (3) and a switching device (5), which can be moved into a separated position (I) in which the contacts (3) are electrically separated from one another. The presence of the switching device (5) in the separated position (I) is detected by a contact-free measurement of the position of the switching device (5). A switching arrangement (1) comprises a detector (8) with which the presence of the switching device (5) in the separated position (I) can be detected in a contact-free manner EP3041013A discloses a motor starter or contactor having a radio frequency identification (RFID) tag incorporated therein for accurate determination of the position of contacts in the motor starter/contactor is disclosed. The motor starter/contactor includes separable contacts comprising a fixed contact structure and a movable contact structure having a closed position and an open position. An electromagnet is also included in the motor starter/contactor that is arranged to translate the movable contact structure between the closed position and the open position. An RFID tag is positioned on or adjacent the separable contacts to indicate the position of the movable contact structure in the motor staiter/contactor.

EP2290666A discloses an attachment module provided with a moving plunger (2) which is connected by an interface to a switching device (9) which has switching piece for switching a contact with contact material. The measuring elements (4,5) are provided for measuring the position change (3) of the plunger when the contact is closed. An independent claim is also included for a method for monitoring the life of a switching device.

SUMMARY

In an embodiment, the present invention provides a contactor, comprising: at least one moveable contact mounted on a contact carrier; at least one stationary contact mounted on a housing; an electromagnet configured to cause the contact carrier to move relative to the housing between a first position and a second position, and thus to cause the at least one moveable contact to travel from a contacts open position to a contacts closed position with respect to the at least one stationary contact; a sensor coupled to one of the contact carrier and the housing and configured to detect an intermediate position, in between the first position and the second position, at which the housing and the contact carrier are located at a given moment in time as the contact carrier moves relative to the housing between the first position and the second position; and a controller connected to receive the signals from the sensor and configured to use the signals to detect various intermediate positions of the contact carrier between the first position and the second position to monitor transition of the contact carrier between the first position and the second position, wherein the controller is configured to use the signals from the sensor to determine an over-travel time comprising a time during which the contact carrier continues movement in one direction after engagement between the at least one moveable contact and the at least one stationary contact

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following.

DETAILED DESCRIPTION

Figure 1:
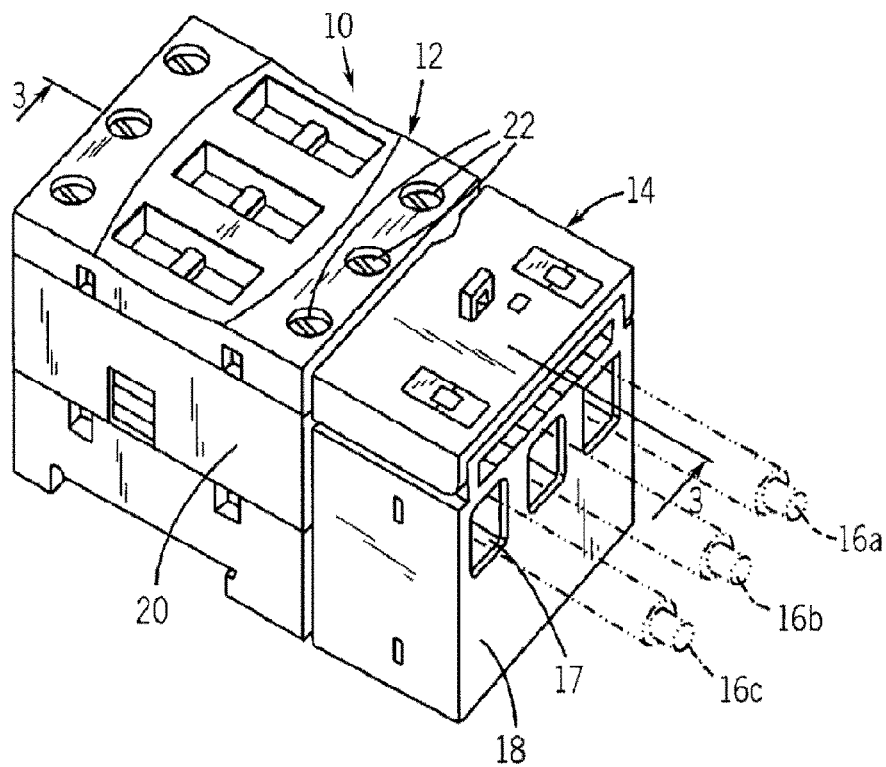
FIG. 1 is a perspective view of a contactor/motor starter in accordance with the present invention.

A first aspect of the specification provides a contactor as described herein.

The controller may be configured to use the signals to determine a time taken for transition of the contact carrier from the first position to the second position.

The controller may be configured to use the signals to determine a time taken for transition of the contact carrier from the second position to the first position.

The controller may be configured to detect an existing fault based on the monitored transition of the contact carrier between the first position and the second position. The controller may be configured to detect a developing fault based on the monitored transition of the contact carrier between the first position and the second position. The controller may be configured to detect a contact weld condition based on the signals from the sensor. In any of these cases, the controller may be configured to generate an alert based on the detected fault, or condition.

The controller may be configured to report information about the condition of the contactor via a reporting output line. This controller may be configured to send a message indicating whether the contactor is faulty or not. Alternatively or additionally, the controller may be configured to send a message indicating a time taken for the contactor to move from a contacts open condition to a contacts close position, and/or to send a message indicating a time taken for the contactor or to move from a contacts close position to a contacts open position. Alternatively or additionally, the controller may be configured to report information identifying the movement of the contact carrier relative to the housing.

The housing may include a main housing and a removable accessory module and the sensor may be included within the accessory module.

A second aspect of the specification provides method in a contactor as described herein.

The method may comprise the controller using the signals to determine a time taken for transition of the contact carrier from the first position to the second position.

The method may comprise the controller using the signals to determine a time taken for transition of the contact carrier from the second position to the first position.

The method may comprise the controller detecting an existing fault based on the monitored transition of the contact carrier between the first position and the second position.

The method may comprise the controller detecting a developing fault based on the monitored transition of the contact carrier between the first position and the second position.

The method may comprise the controller detecting a contact weld condition based on the signals from the sensor. The method may comprise the controller generating an alert based on the detected fault, or condition.

The method may comprise the controller reporting information about the condition of the contactor via a reporting output line. The method may comprise the controller sending a message indicating whether the contactor is faulty or not. The method may comprise the controller sending a message indicating a time taken for the contactor to move from a contacts open condition to a contacts close position, and/or to send a message indicating a time taken for the contactor or to move from a contacts close position to a contacts open position. The method may comprise the controller reporting information identifying the movement of the contact carrier relative to the housing.

Various other aspects, features, and advantages of the present invention will be made apparent from the following detailed description and the drawings.

The present invention relates generally to electrical switching devices, and more particularly, to a method and apparatus for monitoring the wellness of, especially electromagnetic contactors. The present invention uses a sensor to track, in a fine-grained manner, movement of a contact carrier relative to a housing as the contact carrier moves relative to the housing between first and second positions. The tracked movement is used to monitor performance. The tracked movement is used also to determine indications of impending faults or existing faults of the device. The tracked movement is used to determine opening and closing times of contacts.

The use of the sensor avoids the need for an external safety relay to monitor contactor operation time. Also, the sensor and controller provides an auxiliary system for safety (and can for instance allow safety standards to be met) but without requiring the contactor to have auxiliary contacts. If the contactor implements a SIL (safety integrity level) certified sensor, the use of the sensor to monitor contactor operation time and status also comply with SIL and the contactor can thus be used for safety related process and control system, Referring to FIG. 1, the present invention will initially be described in reference to a motor starter 10, comprising a contactor 12 and an overload relay 14, that is shown in perspective view. However, the present invention can also be implemented into multiple types of contactors, starters, motor starter units, electronic overload relay units, and such like. Further, it will be appreciated that the wellness monitoring aspects of the present invention are not limited to contactors, motor starters, or to the particular type of electromagnetic contactor 12 or relay unit 14 shown in the Figures. The present invention finds equivalent utility with other contactor types in other applications, such as, for example, unitary contactors, modular contactors, independently controllable contactors, contactors designed to switch other than three-phase inputs, and contactors having other arrangements of contacts, biasing mechanisms, and armatures.

In the embodiment depicted, motor starter 10 is a multi-phase motor starter as commonly used in industrial control applications, such as motor control. Motor starter 10 includes the contactor 12 and the overload relay 14. Contactor 12 is an electromagnetic contactor for switching supply current to a load. Overload relay 14 senses and measures the current to the load, and shuts off or de-energizes contactor 12 if too much current (overload) is flowing to the load, thus protecting the motor. Overload relay 14 is shown connected with the contactor 12 at one end and accepts a series of conductors 16*a*, 16*b*, and 16*c* (shown in phantom) at another end through overload relay housing 18. Conductors 16*a*, 16*b*, and 16*c* extend through overload relay 14 and into contactor housing 20 and are secured to lugs 22. Not all overload relays are pass through and the conductors 16*a*, 16*b* and 16*c* could instead be secured to lugs on the overload relay 14. It is appreciated, however, that other embodiments of motor starter 10, contactor 12, and/or relay 14 may switch more or fewer lines, and thus may accept more or fewer conductors 16.

Figure 2:
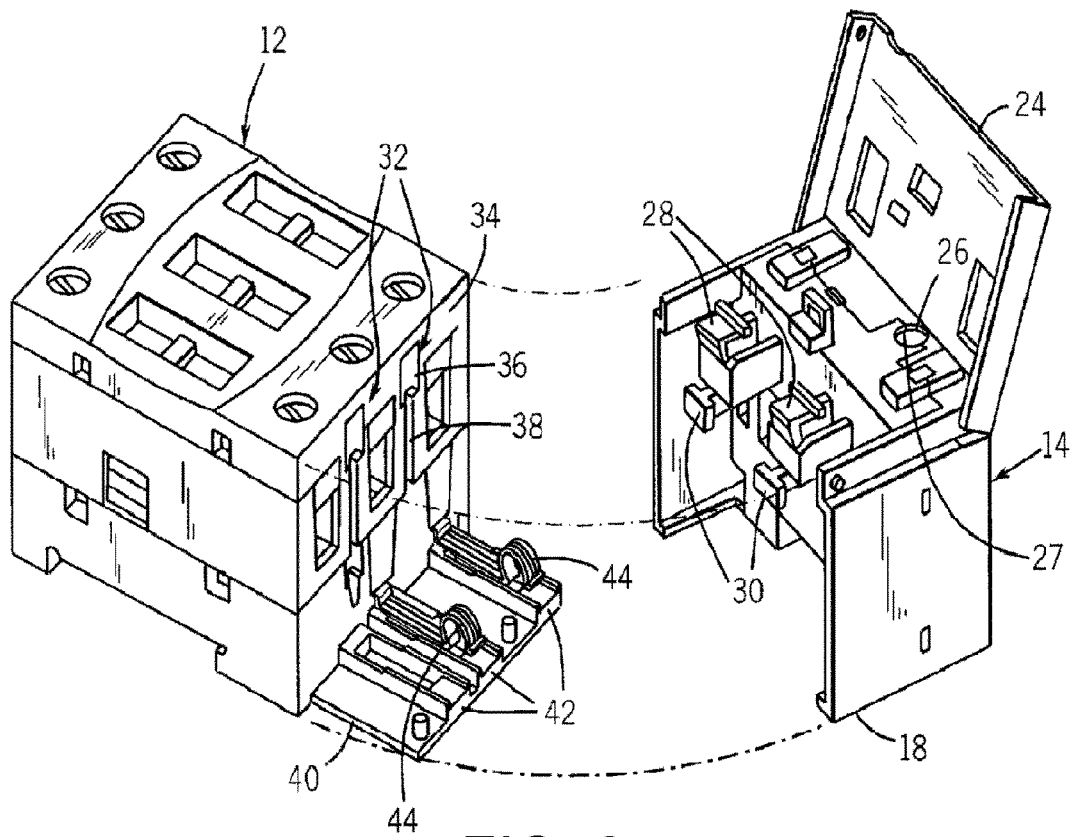
FIG. 2 is a perspective view of the contactor/motor starter of FIG. 1 with the contactor and overload relay separated.

Referring to FIG. 2, overload relay 14 and contactor 12 are shown in separation. Cover 24 of overload relay 14 is shown in a cover open position. Overload relay housing 18 includes a circular opening 26 through which the rotary knob of a potentiometer 27 connected to a printed circuit board is disposed. Potentiometer 27 includes a screwdriver type slot for adjustment of the full load amperage of the particular motor with which the motor starter 10 is to be used.

In some embodiments, the physical connection between overload relay 14 and contactor 12 is made with flexing lock tabs 28, which are each connected to a T-shaped retaining projection 30. Retainer projections 30 are insertable into connecting slots 32 within housing wall 34 of contactor 12. Receiving channels 36 of connecting slots 32 terminate in a retaining channel 38 which is narrower than the receiving channel 36 so as to prevent removal of a retaining projection 30 inserted into receiving channel 36 and slid downwardly into retaining channel 38. When a retainer projection 30 has been slid down into retaining channel 38, flexing lock tabs 28 will snap into connecting slots 32 of housing wall 34.

Contactor 12 includes a platform 40 which is integral with and extends substantially transversely to the plane of contactor wall 34. Platform 40 includes supports 42 for supporting flexible coil terminals 44 which extend outwardly from within the contactor 12. When coupled with contactor 12, the overload relay 14 is placed over the platform 40 to make an electrical connection with flexible coil terminals 44. In the embodiment shown, each coil terminal 44 is comprised of three separate conductive leads, while other similar embodiments utilize a number of separate coil terminals per phase connection. In alternative implementations, each phase connection may have one coil terminal 44 with one conductive lead. Electrical connections may also be integrated with lock tabs 28 or retaining projection 30. In addition, while only two terminals 44 are shown, it is contemplated that other numbers and arrangements of terminals may be utilized. Contactor 12 may include a terminal 44 corresponding to each switched line or may include a number of terminals 44 for monitoring and controlling fewer than all switched lines of the contactor 12. Thus, a variety of electrical connections between contactor 12 and overload relay 14 can be achieved are known.

Figure 3:
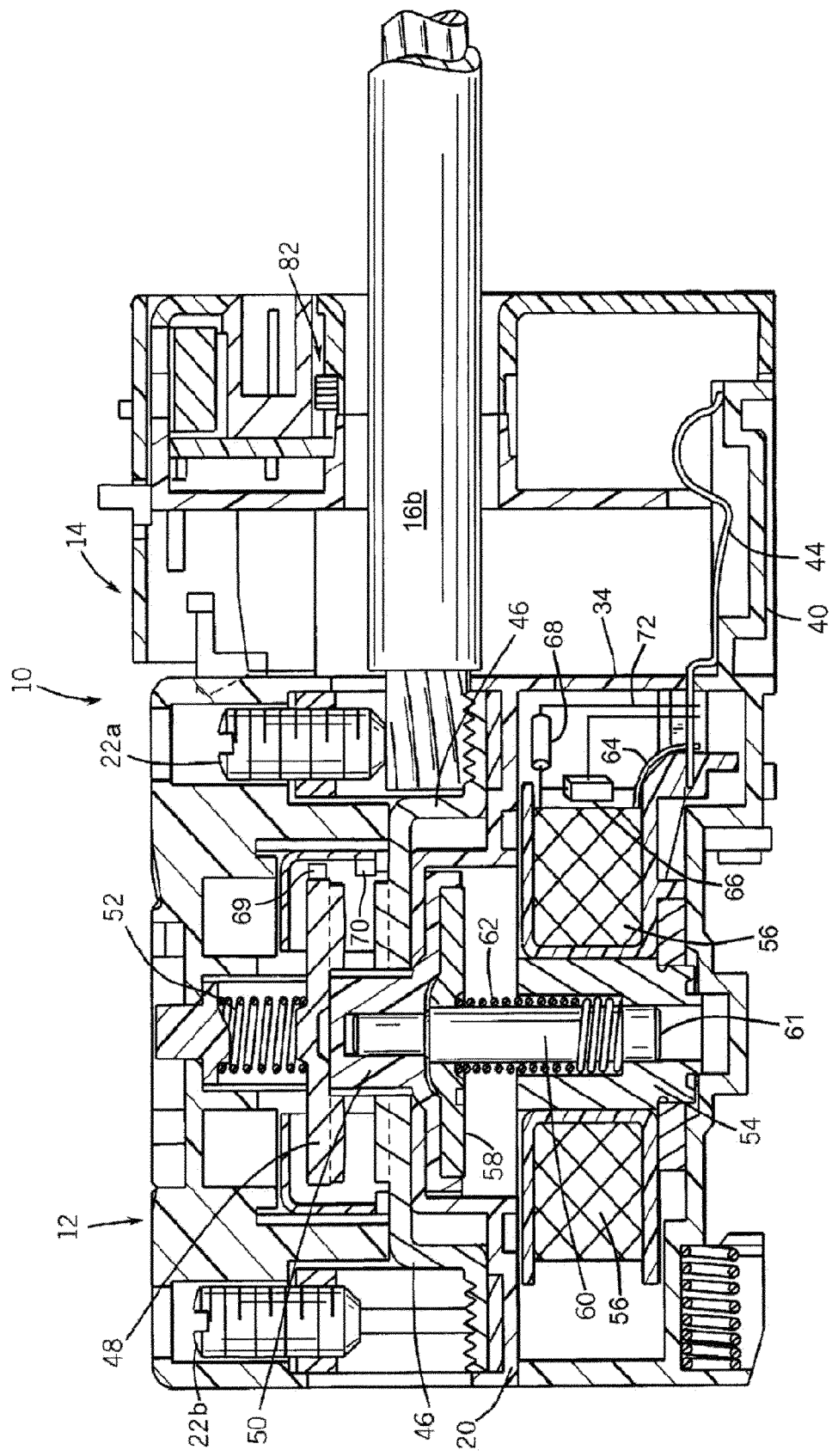
FIG. 3 is a cross-sectional view of the contactor/motor starter of FIG. 1 taken along line 3-3 of FIG. 1.

Referring to FIG. 3, a cross sectional view of the motor starter 10 taken along line 3-3 of FIG. 1 is shown. Motor starter 10 is depicted in its coupled position wherein contactor 12 and overload relay unit 14 are physically and electrically engaged. One lug 22a of contactor 12 is shown securing conductor 16b to a stationary contact 46 on the load side of contactor 12. The other lug 22b is shown in an unfastened position on the line side of contactor 12. In the embodiment shown, one of the contact assemblies of contactor 12 includes a pair of stationary contacts 46 mounted to the contactor housing 20. A pair of moveable contacts 48 is mounted to a moveable contact carrier 50. The moveable contacts 48 are biased toward the stationary contacts 46 by a moveable contact biasing mechanism 52.

A magnetic core 54 surrounded by an electromagnetic coil 56 in a conventional manner is located on a base portion of contactor housing 20. In other embodiments, core 54 and coil 56 may be positioned above contacts 46, 48. The magnetic core 54 and the electromagnetic coil 56 are in a fixed position relative to the contactor housing 20.

Magnetic core 54 is advantageously a solid iron member. Electromagnetic coil 56 may be configured to operate on direct current (DC) or alternating current (AC). When energized, magnetic core 54 attracts a magnetic portion or armature 58 of moveable contact carrier 50. Moveable contact carrier 50, along with magnetic armature 58, is guided towards the magnetic core 54 along guide pin 60.

In regard to the electrical connection between contactor 12 and overload relay 14, a primary coil connector 64 extends from electromagnetic coil 56 and is electrically connected to coil terminal 44. Coil connector 64 conducts the DC control voltage and current for operating electromagnetic coil 56 from overload relay 14 via terminal 44.

Guide pin 60 is press-fit or molded securely into moveable contact carrier 50 at one end and is slidable along an inner surface of magnetic core 54. The single guide pin 60 is centrally disposed and is utilized in providing a smooth and even path for the armature 58 and moveable contact carrier 50 as they travel to and from the magnetic core 54. Advantageously, guide pin 60 and inner surface of magnetic core 54 are manufactured so as to limit friction therebetween. Friction during movement of guide pin 60 and carrier 50 can be a major limiting factor on the useable life of a contactor. Guide pin 60 is partially enclosed by a resilient armature return spring 62, which is compressed as the moveable contact carrier 50 moves toward the magnetic core 54. Armature return spring 62 biases the moveable contact carrier 50 and the armature 58 away from magnetic core 54. Additionally, a bottom portion 61 of guide pin 60 may be used to dampen the end of its downward movement to help reduce bounce and cushion the closure of the armature 58 with magnetic core 54.

Advantageously, guide pin 60, carrier 50, armature 58, and moveable contacts 48 are configured to allow carrier over-travel. In other words, when moveable contacts 48 fully engage stationary contacts 46, guide pin 60, carrier 50, and armature 58 can continue downward movement a certain distance known as an over-travel. This is achieved by integrating a resilience or flexibility in the connection between moveable contacts 48 and carrier 50. Thus, an increased pressure on the engagement between moveable contacts 48 and stationary contacts 46 is achieved. The time during which guide pin 60, carrier 50, and armature 58 continue downward movement after contact engagement is commonly known as the over-travel time. Contact carrier over-travel distance can be measured by determining the over-travel time. A number of factors can cause over-travel and over-travel time to decrease, such as contact surface wear or erosion, or carrier jam. Once over-travel has decreased to a certain point, the total pressure maintaining engagement of the contacts can reach unacceptable levels, potentially causing contactor failure. Therefore, over-travel time can be an effective indicator of the wellness or remaining useable life of a contactor.

A magnet 69 is mounted to the armature 58, and thus is configured to move along with the contact carrier 50.

A magnet-sensing sensor 70 is coupled to the housing 20 in relatively close proximity to the magnet 69. The sensor 70 is of a type such that signals provided at output terminal(s) thereof are processable to derive an instantaneous location of the sensor 70 relative to the magnet 69, and thus derive an instantaneous location of the contact carrier 50 relative to the stationary contacts 46 and the housing 20.

In some embodiments, the sensor 70 is a Hall effect sensor. In these embodiments, a location of the contact carrier 50 is derivable from outputs of the Hall effect sensor 70. In particular, outputs of the Hall effect sensor 70 vary as the magnet 69 moves relative to the sensor 70. As such, signals provided by the Hall effect sensor 70 are able to be processed such as to identify an instantaneous separation distance between the sensor 70 and the magnet 69, and thus determine an instantaneous position of the contact carrier 50 relative to the stationary contacts 46. It will be appreciated that sensor Voltage output varies linearly with sensor position in the case of certain types of Hall sensor.

Figure 4:
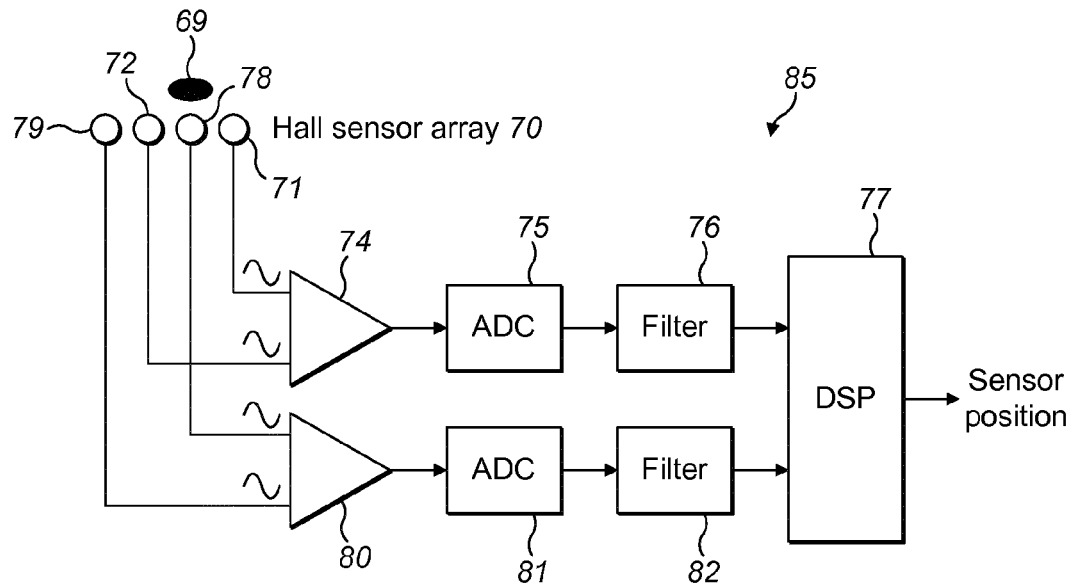
FIG. 4 is a schematic diagram of a signal processor arrangement forming part of the contactor/motor starter of FIGS. 1 to 3.

An example signal processing arrangement 85 is shown in FIG. 4. Here, the sensor 70 is shown as an array of sensors including first and second sensors 71, 72. These sensors 71, 72 are connected to respective inputs of an amplifier 74, an output of which is connected to an input of an analogue to digital converter (ADC) 75. The amplifier 74 amplifies the signal provided by the sensor 70. The ADC 75 converts the amplified signal into the digital domain. A digital filter 76 is connected to the output of the ADC 75. The digital filter 76 provides filtering (pre-processing) of the digitized sensor signal. The digital filter 76 includes algorithms (readily creatable by the skilled person) that are configured to measure sensor input and derive contactor pole movement therefrom. The digital filter 76 also contains safety related fail safe algorithms, which provide safety integrity of sensor measurement. The resulting pre-processed signal is provided to an input of a digital signal processor (DSP) 77. The DSP 77 is configured to process the input signals, which are derived from the sensor 70, and to provide an output indicative of the position of the magnet 69, and thus the contact carrier 50, relative to the sensor 70, and thus the housing 20.

In the example signal processing arrangement 85 shown in FIG. 4, the sensor array 70 includes four sensors. Third and fourth output sensors 78, 79 are connected to respective inputs of a second amplifier 80. An output of the second amplifier 80 is connected to an input of a second ADC 81. The output of the ADC 81 is connected to an input of a second digital filter 82. An output of the second filter 82 is connected to a second input of the DSP 77. The DSP 77 is configured to process the signals provided by the second filter 82 in conjunction with the signals provided by the first filter 76 in order to provide the output indicative of the position of the sensor 70 relative to the magnetic core 54. In this way, a more accurate determination of the position of the sensor 70 relative to the magnet 69 (and thus the contact carrier 50 relative to the stationary contacts 46) can be determined compared to an alternative in which there is only a single signal processing channel.

Instead of digital filters 76, 82, analogue filters may be used. In this case, the analogue filter is located between the output of the amplifier 74, 80 and the ADC 75, 81. Alternatively, the filters 76, 82 may be omitted. In this case, any needed filtering may be performed by the DSP 77.

An operation cycle of contactor 12 begins at a contacts open position in which moveable contacts 48 are not in engagement with stationary contacts 46 and no line or phase current is flowing therethrough. A closing operation commences when coil 56 is energized by a DC control voltage causing magnetic core 54 to attract magnetic armature 58 of contact carrier 50. The downward attraction of armature 58 causes carrier 50 and pin 60 to overcome the bias of armature return spring 62. One of the phases of a three phase line current will begin to flow through conductor 16*b* when moveable contacts 48 first touch stationary contacts 46. Advantageously, as described above, contact carrier 50, armature 58, and guide pin 60 continue to move downward after contacts 46 and 48 have fully engaged until the armature 58 seals against the upper surface of core 54, stopping movement. The over-travel of carrier 50 increases contact engagement pressure to better hold moveable contacts 48 and stationary contacts 46 together.

The signal processing arrangement 85 processes output signals from the sensor 70 and allows tracking of the location of the contact carrier 50, as it moves during the contacts closing operation cycle of the contactor 12. The tracking involves the detection of various intermediate positions between the contacts open and contacts closed positions, as is described below.

An opening operation commences when the DC control voltage applied to coil 56 is turned off. Current through coil 56 dissipates, and magnetic core 58 ceases to attract armature 58 strongly enough to overcome the bias of armature return spring 62 as well as the contact force springs 52. Thus, carrier 50, armature 58, and guide pin 60 begin upward movement, and are joined by moveable contacts 48 after the over-travel distance. After moveable contacts 48 and stationary contacts 46 are no longer engaged, line current through conductor 16*b* will be interrupted. That is, current will flow between moveable contacts 48 and stationary contacts 46 for a very brief time after disengagement due to arcing, but will cease once the arc extinguishes. The bias of spring 62 causes contactor 12 to return to the contacts open position.

The signal processing arrangement 85 processes output signals from the sensor 70 and allows tracking of the location of the armature 58 and the contact carrier 50, as it moves in the opposite direction during the contacts opening operation cycle of the contactor 12.

As mentioned above, the DSP 77 is configured to process the input signals, which are derived from the sensor 70, and to provide an output indicative of the contact carrier 50 relative to the stationary contacts 46 This applies to the contacts opening operation cycle of the contactor 12 and to the contacts closing operation cycle. The position of the sensor 70 relative to the magnet 69 is determined frequently. Advantageously, the position of the sensor 70 relative to the magnet 69 is determined for each of plural instances in time in a series, each instance being separated from adjacent instances by a clock interval (the inverse of a sampling rate) which may for instance be of the order of microseconds in duration.

By differentiating the positions, the velocity is determined. The velocity is determined at the sampling rate and can be tracked over the course of the movement of the contact carrier 50 relative to the sensor 70. By differentiating the velocities, the acceleration can be determined. The acceleration is determined at the sampling rate and can be tracked over the course of the movement of the contact carrier 50 relative to the sensor 70.

Figure 5:
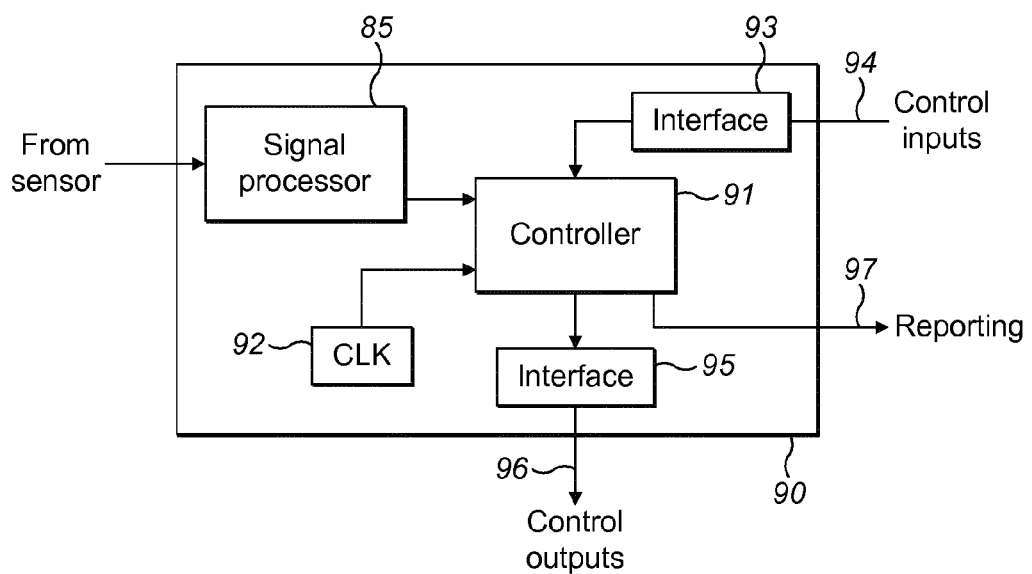
FIG. 5 is a schematic diagram of a control system including the FIG. 4 signal processor arrangement and forming part of the contactor/motor starter of FIGS. 1 to 3.

An example control system 90 is shown in FIG. 5, and will now be described. The control system 90 is based around a controller 91. This may take any suitable form, and may for example a programmed microprocessor, one or more digital signal processors (DSPs), one or more microcontrollers, application specific integrated circuits (ASICs), field programmable logic arrays (FPGAs), or other equivalent integrated or discrete logic circuitry. A clock 92 is coupled to the controller 91, and provides a source of timing information to the controller.

The controller 91 is configured to receive the sensor position output signals of the signal processor 85. In this way, the controller 91 is provided with information about the location of the contact carrier 50 relative to the sensor 70. Moreover, the controller 91 receives the location information in real-time.

The control system 90 is configured to receive control inputs provided by an external system via an interface 93 and a control input line 94. The control system 90 is configured to control the switching of the contactor 12 by providing control output signals via interface 95 on a control output line 96. The control output line 96 is connected to the electromagnetic coil 56 to provide energisation thereof. In particular, the absence of a signal on the control output line 96 results in no energisation of the electromagnetic coil 56, and the presence of a signal on the control output line 96 results in energisation of the electromagnetic coil 56. When the electromagnetic coil 56 is energised, the resulting magnetic field causes a force to be provided on the armature 58 and is thus the contact carrier 50, resulting in movements thereof and closing of the contacts. Alternatively, control of the contactor may be provided by a separate control system.

The controller 91 is configured to provide reporting signals on a reporting line output 97. This allows for reporting of the status of the contactor 12 over an industrial communication network. The reporting line output 97 may for instance be part of an Ethernet, Profibus or Modbus link.

The control system 90 may be located within the housing 20 of the contactor 12. Alternatively, the control system 90 may be located in an auxiliary or accessory contact module that is associated with the contactor 12. Such a module is shown as 101 in FIG. 8.

One of the functions of the controller 91 is to monitor the condition of the contactor 12. In particular, the controller 91 is configured to use the information about the position of the contact carrier 50 relative to the sensor 70, as provided by the signal processor 85, to determine whether the operation of the contactor 12 is healthy, whether there is a fault, and whether a fault is developing.

In particular, the controller 91 is able to detect a welded contacts condition by processing the sensor position signals provided by the signal processor 85 and determining therefrom that the contact carrier 50 has remained in the contacts closed position even after the energising inputs to the electromagnetic coil 56 has been removed.

Also, the controller 91 is able to detect deterioration in the operation of the contactor by determining the time taken for the contactor to move from the contacts open position to the contacts close position after an energising signal is provided to the electromagnetic coil 56. For instance, the controller 91 may be able to detect whether the time taken for the contactor 12 to move from the contacts open position to the contacts closed position is within a predetermined range, or whether it falls outside that range. The determination as to whether the time falls within or without the range provides an indication as to whether the contactor 12 is developing a fault and thus may fail at a time in the future.

The determination of the time taken for the contactor to move from the contacts open position to the contacts closed position may be performed by determining the time elapsed between the energising signal being applied and the location of the contact carrier 50 corresponding to a contacts closed position. Alternatively, it may be performed by determining the time elapsed between the sensor 70 detecting the contact carrier 50 beginning to move and the location of the contact carrier 50 corresponding to the contacts closed position. Further alternatively, it may be performed by determining the time elapsed between the sensor 70 detecting the contact carrier 50 beginning to move and ceasing to move.

Similarly, the controller 91 is able to detect deterioration in the operation of the contactor by determining the time taken for the contactor to move from the contacts closed position to the contacts open position after an energising signal is removed from the electromagnetic coil 56. For instance, the controller 91 may be able to detect whether the time taken for the contactor 12 to move from the contacts closed position to the contacts open position is within a predetermined range, or whether it falls outside that range. The determination as to whether the time falls within or outside of the range provides an indication as to whether the contactor 12 is developing a fault and thus may fail at a time in the near future.

The determination of the time taken for the contactor to move from the contacts closed position to the contacts open position may be performed by determining the time elapsed between the energising signal being removed and the location of the contact carrier 50 corresponding to a contacts closed position. Alternatively, it may be performed by determining the time elapsed between the sensor 70 detecting the contact carrier 50 beginning to move and the location of the contact carrier 50 corresponding to the contacts open position. Further alternatively, it may be performed by determining the time elapsed between the sensor 70 detecting the contact carrier 50 beginning to move and ceasing to move.

The controller 91 is configured to report information about the condition of the contactor 12 via the reporting output line 97. The reporting of information may involve the controller 91 sending a message indicating whether the contactor 12 is faulty or not. The reporting of information may additionally involve the controller 91 sending a message indicating that a fault is developing. The reporting of information may involve sending technical parameters. For instance, the reporting of information may involve sending a message indicating a time taken for the contactor to move from a contacts open condition to a contacts close position, and/or sending a message indicating a time taken for the contactor or to move from a contacts close position to a contacts open position. The reporting of information may alternatively involve sending information identifying the movement of the contact carrier 50 relative to the housing 20. For instance, the information may include a time series of data, with each data item indicating a location at a particular moment in time. Alternatively, the information may represent the movement, for instance by defining the location as a function of time. By sending information identifying the movement of the contact carrier 50 relative to the housing, an external device may be able to derive information relating to the condition of the contactor 12.

The controller 91 is configured to determine an over-travel time, which is discussed below. This measure may be used by the controller 91 to determine a condition of the contactor 12. Alternatively or in addition, the over-travel time may be sent in a message to a remote device.

The information determined by the controller 91 based on information provided by the signal processor 85, based on output of the sensor 70, constitute useful metrics by which the wellness, or remaining usable life, of the contactor 12 can be determined.

These wellness metrics may then be averaged over a number of contactor cycles by the controller 91. The longer the period chosen to average values, the less will be the impact of false start or stop indications. However, a longer averaging period can also lead to decreased precision if only averaged values are compared to thresholds. An appropriate averaging period for a given implementation depends upon the type of contactor used and the desired precision.

Most contactors and motor starters have manufacturer test data indicating over-travel, over-travel time, armature pull-in, and/or coil current differential thresholds. These thresholds can be absolute values or can represent percentage decreases from new contactor parameters. Once these thresholds are reached, it can reasonably be expected that a fault is imminent. Tested threshold data usually varies by contactor type, use, and model. Therefore, a controller, such as the overload relay or another external device, may be programmed to store the threshold over-travel time, armature pull-in time, and/or coil current differential value for the contactor in use. These thresholds are compared with the determined actual over-travel times, armature pull-in times, and/or coil current differential values, averaged values, or trends. If the wellness metric value (or values) being compared exceeds the corresponding threshold, a signal or indication of impending or existing fault is issued.

The indication of impending or existing fault may take the form of a warning light or alarm, a user alert, or an automatic shutdown for contactor replacement. If the wellness metric (or metrics) does not exceed the corresponding threshold, then the contactor is permitted to continue operation cycles. The monitoring described above may take place for each operation or cycle of a contactor, after a given number of cycles, or upon a set timing period.

Contact carrier over-travel time may be used as a direct indication of contact remaining life or of the extent of contact surface erosion. Essentially, over-travel time is a parameter that measures the contact force spring compression after contacts engage. As contact surfaces erode, the over-travel distance decreases, resulting in the after-engagement compression force decreasing. The contactor will fail when the total contact force, including magnetic attraction and after-engagement compression, falls below a certain limit. Therefore, contactor remaining life, or "wellness," has a roughly proportional relationship to over-travel time.

In practice, variations will exist in the detected carrier over-travel times, due in part to variations in detection of current start times. Thus, averages over multiple cycles to establish trend lines for a contactor can be very beneficial in predicting impending faults and future extent of wear and erosion, etc. In general, a threshold over-travel time value can reliably be set at about 70% of new contactor over-travel time for determining potential contactor failure, as measured against a decreasing actual over-travel time. As stated above, however, the most appropriate threshold values may vary by contactor and application. Also, since contact erosion and mass loss can occur unequally in the movable contacts or the stationary contacts, and can vary among the contacts for each phase, measuring the over-travel time for all phases is advantageous.

Contact carrier (or armature) pull-in time may be used as an indication that the speed of the carrier, armature, and guide pin during a closing or opening operation is decreased or that the carrier, armature, and/or guide pin are experiencing too much friction. Friction in the contact motion can result simply from wear between the magnetic core and guide pin or between the contact carrier and contactor housing. In other instances, friction can be due to the accumulation of debris generated by contact erosion or arcing. Over the course of many operations, a contactor will inevitably wear, regardless of the cause, and the armature pull-in time will increase. Pull-in times of a contactor will generally increase more drastically the closer a contactor gets to a failure point, after which time contacts cease to close or open altogether. While pull-in times may be compared to threshold values as discussed above, another more relative method for using pull-in times to predict failure incorporates the use of means and/or trend lines. Contactors will experience quite noticeable increases in pull-in time (by factors of around 10%, or up to 50%) just prior to failure. Thus, a trend line indicating a sudden jump in pull-in time can positively predict impending failure.

As discussed above, the information determined by the controller 91 also identifies existing faults.

Figure 6:
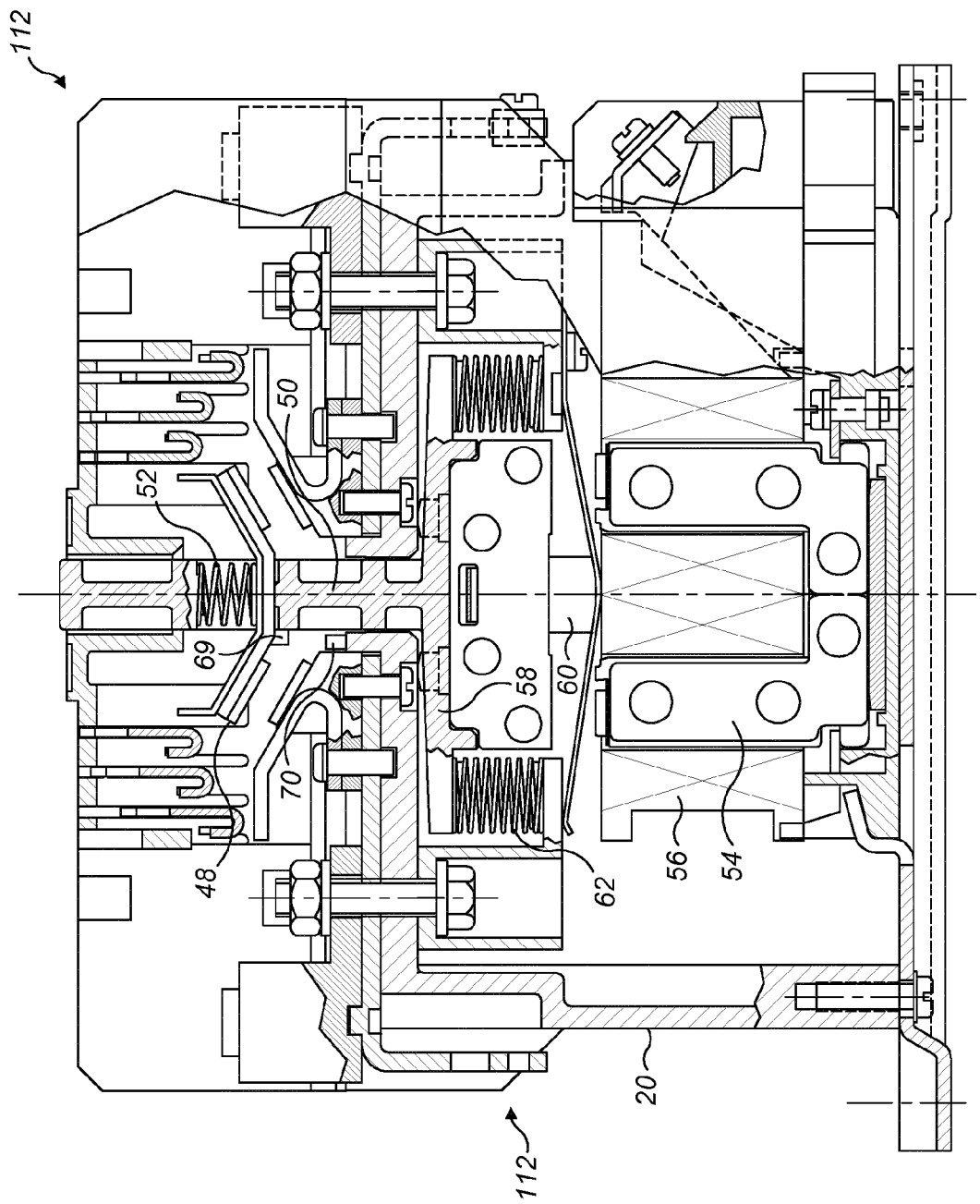
FIG. 6 is a cross-sectional view of an alternative form of contactor according to the invention.

Other applications of the wellness monitor of the present invention can operate as mirror contacts or instead of mirror contacts, can provide real time updating of contactor on and off timings to optimize the performance of Point on Wave control, and can detect re-ignition during contactor switching. That is, due to the ability of the present invention to monitor contact closing and opening times, positive indications of contact closure and full opening and closing cycles can be achieved for increased control and to monitor for system problems not necessarily caused by wear of the contactor FIG. 6 shows a further embodiment of a contactor 112. Reference numerals are retained from FIGS. 1 to 3 for like elements. The basic configuration is the same as for the contactor of FIGS. 1 to 3. There are some structural differences, for instance in the contactor 112, the stationary and movable contacts 46, 48 are angled. The arrangement of the guide pin 60, carrier 50, armature 58, and moveable contacts 48 specifically allows carrier over-travel. The operation of the contactor 112 is substantially the same as the operation of the contactor 12 described above. The magnet 69 is located on the armature 58 and moves with the contact carrier 50, as with the contactor 12. The sensor 70 is in a fixed position relative to the housing 20, as with the contactor 12. Output terminal(s) of the sensor 70 are coupled to the signal processor arrangement 85 and the resulting sensor location information is processed by the controller 91, as described above with reference to FIGS. 4 and 5.

Figure 7:
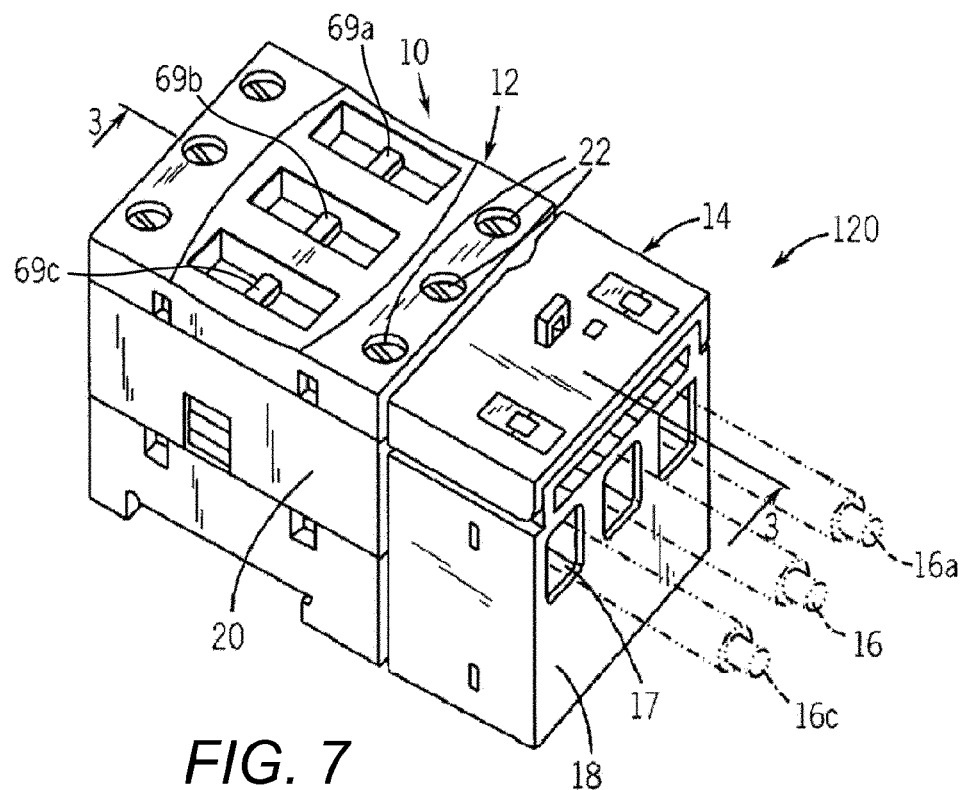
FIG. 7 is a perspective view of another contactor/motor starter in accordance with the present invention.

FIG. 7 shows a further embodiment of a contactor 120. Reference numerals are retained from FIGS. 1 to 3 for like elements. The basic configuration is the same as for the contactor of FIGS. 1 to 3.

An outer surface of the contactor 120 is provided with one or more levers, which in this example comprise three levers (one for each phase of a 3 phase system). The levers are mechanically coupled to the contact carrier 50 so that movement of the contact carrier 50 is communicated to a corresponding movement of the lever. Conventionally, such levers allow a human user to identify whether the contactor is in an open position or a closed position by visual inspection of the position of the lever.

In this embodiment, each of the levers is provided with a magnet 69. In particular, the three levers are provided with three magnets 69a, 69b and 69c. As such, the magnets 69a, 69b and 69c move as the corresponding contact carrier 50 moves.

Figure 8:
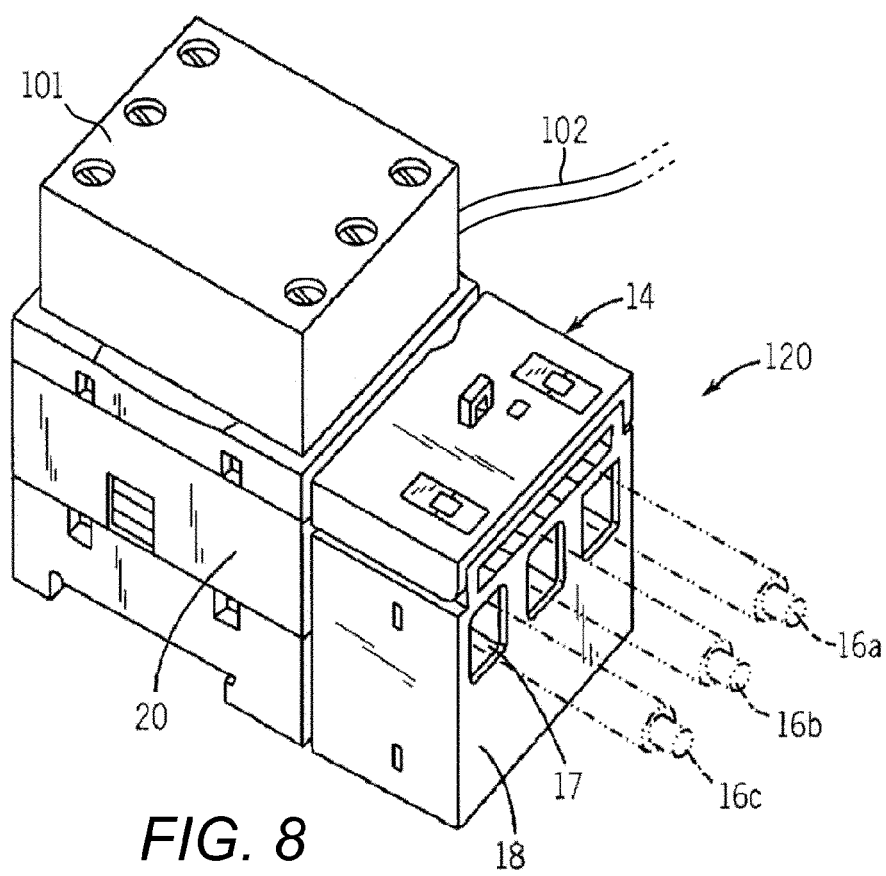
FIG. 8 is a perspective view of the FIG. 7 contactor/motor starter with an accessory device coupled thereto, in accordance with the present invention.

FIG. 8 shows the FIG. 7 contactor 120 with an auxiliary module or accessory module 101 fitted in place. The accessory module 101 is coupled to the housing 20 of the contactor and fits over the levers. The accessory module 101 may be coupled to the housing 20 for instance by a screw arrangement, similar to the screws 22 shown in FIG. 1 and in FIG. 7. Although not shown in FIG. 8, the accessory module 101 includes a sensor 70 that is in a fixed position relative to the housing 20 and is operable to detect the position of one of the magnets 69a, 69b and 69c. As such, the sensor 70 is operable to detect the position of the contact carrier 50 relative to the housing 20. It will be appreciated that there is a separate sensor 70 for each of the levers and thus each of the magnets 69a, 69b and 69c.

The accessory module 101 may be provided with the electronics components of FIGS. 4 and 5. The reporting line output 97 of FIG. 5 is included within an output cable arrangement 102 of the accessory 101 shown in FIG. 8.

The accessory module 101 may include auxiliary contacts. The auxiliary contacts are positioned so as to be switched by movement of the lever, as is conventional. The auxiliary contacts are electrically isolated from the contactor by virtue of the levers.

The FIGS. 7 and 8 contactor 120 provide an advantage that the main body of the contactor does not need to be modified. The key modifications from an off-the-shelf contactor are the provision of the magnets 69a, 69b and 69c on the levers. Since the levers are external to the contactor, providing the levers with the magnets 69a, 69b and 69c can be a relatively straightforward procedure. Aside from the addition of the magnets 69*a*, 69*b* and 69*c*, there are no modifications to the main body of the contactor. Instead, the components that are used to provide the above-stated advantages associated with the sensor arrangement are included in the accessory auxiliary module 101.

In other embodiments, the module including the levers is omitted from the contactor and the mechanical linkage of the contactor that would otherwise connect to the levers (by which the levers are moved when the contact carrier moves) is connected directly to a sensor arrangement of any of the types described above, and configured to monitor movement of the contact carrier 50 relative to the housing 20.

In the above embodiments, the magnet 69 is coupled to and in a fixed position relative to the contact carrier 50 and the sensor 70 is coupled to and in a fixed position relative to the housing 20. In other embodiments, the sensor 70 can be coupled to and in a fixed position relative to the contact carrier 50 and the magnet 69 can be coupled to and in a fixed position relative to the housing 20.

In the above embodiments, the sensor 70 is a Hall effect sensor. However, the sensor may take any other suitable form. In some embodiments, the sensor 70 is an optical sensor. In the case of an optical sensor, the relative positions of the contact carrier 50 (or a part coupled to and in a fixed position relative to the contact carrier) and the housing 20 (or a particular components that is coupled to and in a fixed position relative to the housing 20) are determined using interferometry, or simply using the detected intensity of a transmitted or reflected signal. The sensor 70 may instead be a capacitive sensor, in which the capacitance is dependent on the relative positions of the contact carrier 50 and the housing 20. The sensor 70 may instead detect the relative positions of the contact carrier 50 and the housing 20 on some other basis. For instance, the sensor 70 may be an acceleration sensor coupled to and in a fixed position relative to the contact carrier 50. In this case, the position of the sensor 70 may be determined by integrating outputs of the acceleration sensor 70.

In other embodiments, the contactor of FIG. 7 does not include the magnets 69*a*, 69*b* and 69*c* and instead the accessory or auxiliary module 101 includes a sensor (e.g. an optical sensor) that is operable to detect the position of the levers. This allows the advantages of the sensing arrangement to be achieved without requiring any modification to the main body of the contactor, instead utilizing only components that are included in the accessory auxiliary module 101.

The present invention finds application in augmentation or replacement of safety interlocks or mirror contacts. By not relying upon mechanical implementations for determining contact closure and opening, the present invention avoids many of the problems associated with mirror contacts. Therefore, an indication of contact closure derived from coil current, such as from an indication of the cessation of carrier movement (coil current minimum) after a full range of motion (coil current differential), can be used to gate or interlock the commencement of line current. The gating or interlocking of the commencement of three-phase current flow may be performed by external components as known in the art.

In addition, the present invention has been described thus far with particular reference to one embodiment of a particular contactor type with an overload relay attached thereto. However, it is appreciated and contemplated that the present invention may be embodied in many contactor embodiments in other applications, such as a contactor which does not include an attached relay. Likewise, the present invention may be embodied in contactors of configurations and types other than that discussed herein.

Moreover, reference has been made to multiple parameters, predictors, and indicators for determining contactor wellness. For example, contact over-travel, armature pull-in time, and coil current differential are discussed as useful for estimating future faults or remaining useful life, etc. However, it should be recognized that no single one of these parameters individually is necessary to predict wellness, that all are inter-compatible in determining wellness, and that other components, parameters, predictors, and indicators not explicitly mentioned herein may also be used in conjunction with the present invention.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. A contactor, comprising:
   at least one moveable contact mounted on a contact carrier;
   at least one stationary contact mounted on a housing;
   an electromagnet configured to cause the contact carrier to move relative to the housing between a first position and a second position, and thus to cause the at least one moveable contact to travel from a contacts open position to a contacts closed position with respect to the at least one stationary contact;
   a sensor coupled to one of the contact carrier and the housing and configured to detect an intermediate position, in between the first position and the second position, at which the housing and the contact carrier are located at a given moment in time as the contact carrier moves relative to the housing between the first position and the second position; and
   a controller connected to receive signals from the sensor and configured to use the signals to detect various intermediate positions of the contact carrier between the first position and the second position to monitor transition of the contact carrier between the first position and the second position, wherein the controller is configured to use the signals from the sensor to determine an over-travel time comprising a time during which the contact carrier continues movement in one direction after engagement between the at least one moveable contact and the at least one stationary contact, and wherein a magnet is mounted to an armature of the contact carrier, the armature being configured to move with the contact carrier, and wherein the sensor is configured to sense the magnet and the signals from the sensor are configured to correspond to a distance between the sensor and the magnet for detecting the intermediate position.

2. The contactor of claim 1, wherein the controller is configured to use the signals to determine a time taken for transition of the contact carrier from the first position to the second position.

3. The contactor of claim 1, wherein the controller is configured to use the signals to determine a time taken for transition of the contact carrier from the second position to the first position.

4. The contactor of claim 1, wherein the controller is configured to detect an existing fault based on the monitored transition of the contact carrier between the first position and the second position.

5. The contactor of claim 4, wherein the controller is configured to generate an alert based on the detected fault or condition.

6. The contactor of claim 1, wherein the controller is configured to detect a developing fault based on the monitored transition of the contact carrier between the first position and the second position.

7. The contactor of claim 1, wherein the controller is configured to detect a contact weld condition based on the signals from the sensor.

8. The contactor of claim 1, wherein the controller is configured to report information about a condition of the contactor via a reporting output line.

9. The contactor of claim 8, wherein the controller is configured to send a message indicating whether the contactor is faulty or not.

10. The contactor of claim 8, wherein the controller is configured to send a message indicating a time taken for the contactor to move from a contacts open condition to a contacts close position, and/or to send a message indicating a time taken for the contactor or to move from a contacts close position to a contacts open position.

11. The contactor of claim 8, wherein the controller is configured to report information identifying the movement of the contact carrier relative to the housing.

12. The contactor of claim 1, wherein the housing includes a main housing and a removable accessory module, and wherein the sensor is included within the accessory module.

13. The contactor of claim 1, wherein the sensor is a magnet-sensing sensor coupled to the housing and in proximity to the magnet, the magnet-sensing sensor is configured to output the signals, and wherein the controller is configured to derive an instantaneous location of the magnet-sensing sensor relative to the magnet.

14. The contactor of claim 1, wherein the controller is configured to detect a plurality of intermediate positions of the contract carrier in a time series as the contact carrier moves from the first position to the second position.

* * * * *